United States Patent [19]

Sato

[11] Patent Number: 5,169,801

[45] Date of Patent: Dec. 8, 1992

[54] METHOD FOR FABRICATING A SEMICONDUCTOR DEVICE

[75] Inventor: Natsuki Sato, Tokyo, Japan

[73] Assignee: NEC Corporation, Tokyo, Japan

[21] Appl. No.: 816,841

[22] Filed: Dec. 31, 1991

Related U.S. Application Data

[63] Continuation of Ser. No. 547,693, Jul. 2, 1990, abandoned.

[30] Foreign Application Priority Data

Jun. 30, 1989 [JP] Japan .................................. 1-169070

[51] Int. Cl.$^5$ .......................................... H01L 21/44
[52] U.S. Cl. .................................... 437/195; 437/187;
437/194; 437/231; 437/982; 148/DIG. 133
[58] Field of Search ............... 437/195, 187, 228, 982, 437/231, 194, 200; 148/DIG. 133, DIG. 139

[56] References Cited

U.S. PATENT DOCUMENTS

| | | | |
|---|---|---|---|
| 3,825,442 | 7/1974 | Moore | 437/982 |
| 4,355,454 | 10/1982 | Tasch, Jr. et al. | 437/195 |
| 4,489,481 | 12/1984 | Jones | 437/228 |
| 4,605,470 | 8/1986 | Gwozdz et al. | 357/71 R |
| 4,654,113 | 3/1987 | Tuchiya et al. | 437/187 |
| 4,708,770 | 11/1987 | Pasch . | |
| 4,741,926 | 5/1988 | White et al. | 437/231 |
| 4,743,564 | 5/1988 | Sato et al. | 437/982 |
| 4,753,866 | 6/1988 | Welch et al. . | |
| 4,885,262 | 12/1989 | Ting et al. | 437/231 |

FOREIGN PATENT DOCUMENTS

| | | | |
|---|---|---|---|
| 0249173 | 12/1987 | European Pat. Off. . | |
| 0173856 | 9/1985 | Japan | 437/195 |
| 0239548 | 10/1987 | Japan | 437/231 |
| 0086545 | 4/1988 | Japan | 437/235 |
| 0086546 | 4/1988 | Japan | 437/228 |
| 0086547 | 4/1988 | Japan | 437/235 |
| 2191338 | 12/1987 | United Kingdom . | |

OTHER PUBLICATIONS

Silicon Processing for VLSI; Wolf and Tauber; 1986; vol. 1; pp. 185–191, pp. 423–437.
Process Considerations for Using Spin-on-Glass as a Planarizing Dielectric Film; Pai et al.; Jun. 1987, IEEE V-Mic Conf., pp. 364–370.

Primary Examiner—Brian E. Hearn
Assistant Examiner—Michael Trinh
Attorney, Agent, or Firm—Laff, Whitesel, Conte & Saret

[57] ABSTRACT

A method for fabricating a semiconductor device comprises the steps of forming an insulating layer by the CVD method on a main surface of a semiconductor substrate, fluidizing the insulating layer by heat treatment, unifying a thickness of the insulating layer, opening contact holes in desired points of the insulating layer, and forming conductor contacts for interconnection on the contact holes. The insulating layer is has a uniform thickness in any area on the semiconductor device, so that over-etching of the insulating layer in opening contact holes can be prevented, and the step coverage is well improved.

9 Claims, 4 Drawing Sheets

METHOD FOR FABRICATING A SEMICONDUCTOR DEVICE

This application is a continuation of application Ser. No. 07/547,693, filed Jul. 2, 1990, now abandoned.

FIELD OF THE INVENTION

The invention relates to a method for fabricating a semiconductor device, and more particularly, to a method for fabricating a semiconductor device in which an insulating layer thereof has a uniform thickness.

BACKGROUND OF THE INVENTION

Planar technology to fabricate semiconductor devices is now important for progress in electronics. Such a type of a conventional method for fabricating a semiconductor device comprises the steps of forming an insulating layer on a main surface of a semiconductor substrate, fluidizing the insulating layer by heating to smooth the surface thereof, opening contact holes in desired points of the insulating layer, and forming conductor contacts on the contact holes for interconnection.

In the conventional method for fabricating a semiconductor device, however, there is a disadvantage in that a thickness of the insulating layer is not uniform, so that over-etching of the insulating layer can occur in a patterning step of the contact holes, which causes damage to the surface of the semiconductor substrate. Moreover, some of the contact holes are quite deep and have steep side walls in the ununified insulating layer, so that the step coverage is poor and cracks of the conductor contacts can develop.

SUMMARY OF THE INVENTION

Accordingly, it is an object of the invention to provide a method for fabricating a semiconductor device in which a thickness of an insulating layer of the semiconductor device is unified. That consequently prevents over-etching of the insulating layer in opening contact holes and improves the step coverage of the conductor contacts formed on the contact holes.

According to a feature of the invention, a method for fabricating a semiconductor device comprises the steps of forming an insulating layer by the CVD method on a main surface of a semiconductor substrate, fluidizing the insulating layer by heat treatment, unifying a thickness of the insulating layer, opening contact holes in desired points of the insulating layer, and forming conductor contacts for interconnection on the contact holes.

BRIEF DESCRIPTION OF THE DRAWING

The invention will be explained in more detail in accordance with following drawings wherein.

DESCRIPTION OF THE PREFERRED EMBODIMENT

Before describing a method for fabricating a semiconductor device according to the invention, a conventional method for fabricating a semiconductor device briefly described before will be explained in conjunction with FIGS. 1 to 3.

Figure 1:
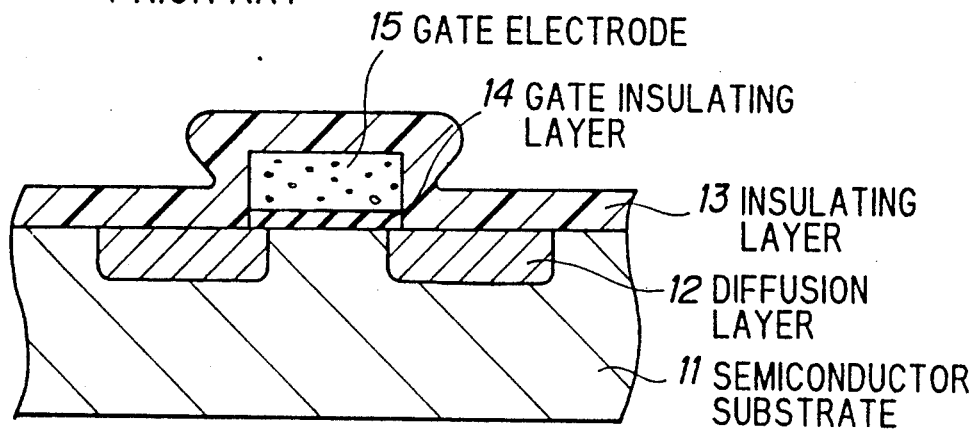
FIGS. 1 to 3 are cross-sectional views illustrating a semiconductor device during various stages of production in accordance with the conventional method.

FIG. 1 shows a cross-sectional view of a semiconductor device under fabrication. The semiconductor device in this stage shown in FIG. 1 comprises a semiconductor substrate 11, two diffusion layers 12, 12 which are formed in the vicinity of the surface of the semiconductor substrate 11, a gate insulating layer 14 which is formed on the surface of the semiconductor substrate 11 between the two diffusion layers 12, 12, a gate electrode 15 which is formed on the gate insulating layer 14, and an insulating layer 13 which is covering the surface of the semiconductor device. The insulating layer 13 is formed, for example, by depositing borophosphosilicate glass (BPSG) using the CVD technique. In this stage, the insulating layer 13 has a rough surface and the step coverage is poor, so that it is necessary to smooth the surface thereof.

Figure 2:
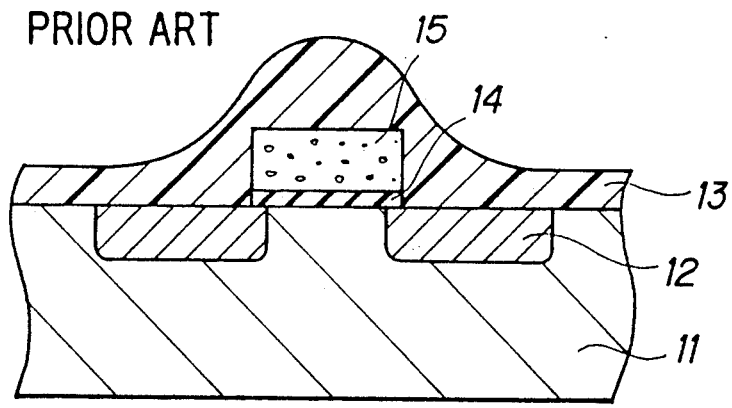

FIG. 2 shows a cross-sectional view of the semiconductor device of FIG. 1 after the insulating layer 13 is fluidized by reflow treatment with heating to smooth the surface thereof. The surface thereof is now smoothed but rising above the gate electrode 15, so that the insulating layer 13 on the gate electrode 15 is thicker than that in other regions.

Figure 3:
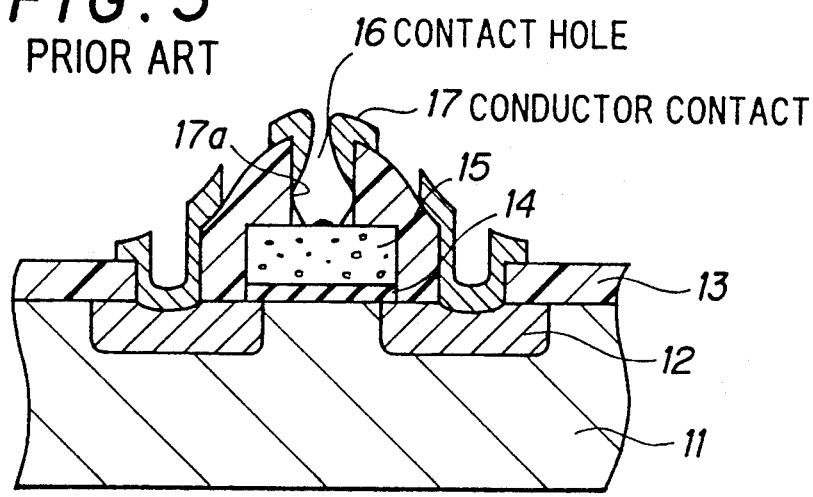

FIG. 3 shows a cross-sectional view of the semiconductor device of FIG. 2 after contact holes 16 are formed in the insulating layer 13 and conductor contacts 17 are formed on the contact holes 16 for interconnection. The contact holes 16 and conductor contacts 17 are patterned by the photolithography technique. The insulating layer 13 on the gate electrode 15 is thicker than that in other regions, especially in the diffusion layer 12, as mentioned above. Therefore the condition of the etching time for opening contact holes should be adjusted to a condition in which a contact hole is formed in the thickest region of the insulating layer 13, namely that on the gate electrode 15. As a result, the insulating layer 13 in the thin region such as that on the diffusion layer 12 can be over-etched, causing damage to the surface of the device, namely the diffusion layer 12. On the other hand, the contact hole 16 on the gate electrode 15 is deeper than these in other regions and the side wall thereof is steep, causing cracks 17a of the conductor contacts 17 as shown in FIG. 3.

Next, preferred embodiments of the invention will be described in detail in conjunction with FIGS. 4 to 11.

Figure 4:
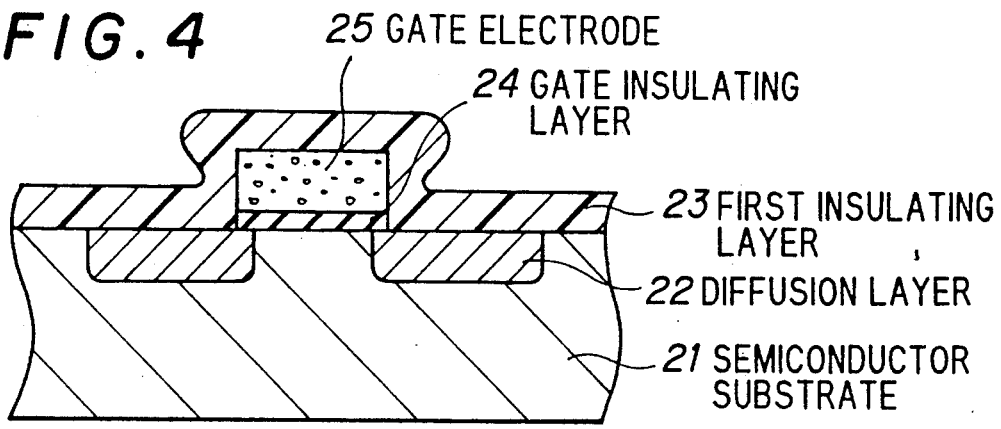
FIGS. 4 to 11 are cross-sectional views illustrating a semiconductor device during various stages of production in accordance with the invention.
Figure 5:
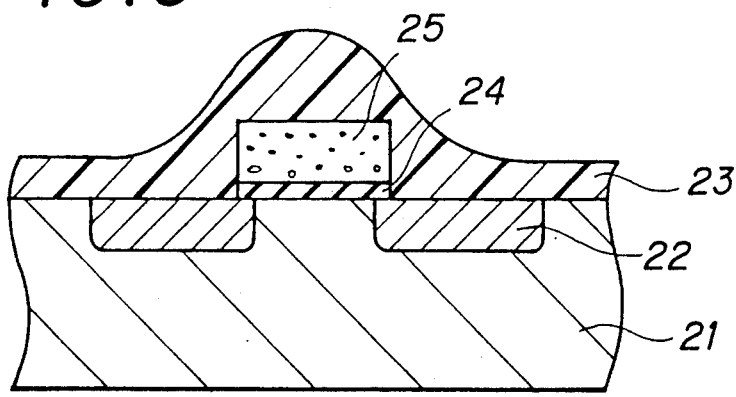

A semiconductor device is provided, which is fabricated from a semiconductor substrate 21 having two diffusion layers 22, 22, and a gate comprising a gate insulating layer 24 and a gate electrode 25 is also formed on the semiconductor substrate 21. Then a first insulating layer 23, which is made of borophosphosilicate glass (BPSG) for example, is formed by the chemical vapor deposition (CVD) method on the surface of the semiconductor device, as shown in FIG. 4. Then, a reflow treatment (fluidizing treatment by heating) of the first insulating layer 23 is done to smooth the surface thereof as shown in FIG. 5. The surface thereof is now smoothed but rising above the gate electrode 25, so that the first insulating layer 23 on the gate electrode 25 is thicker than that in other regions, which is the same as shown in FIG. 2.

Figure 6:
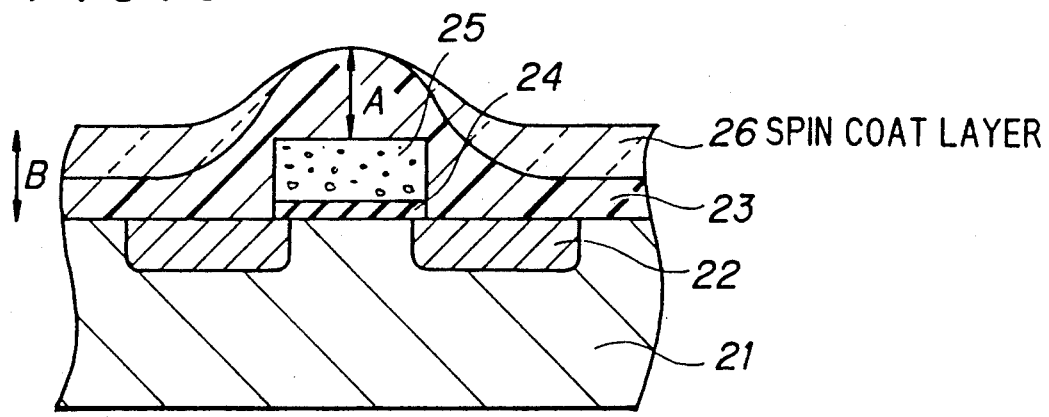
Figure 7:
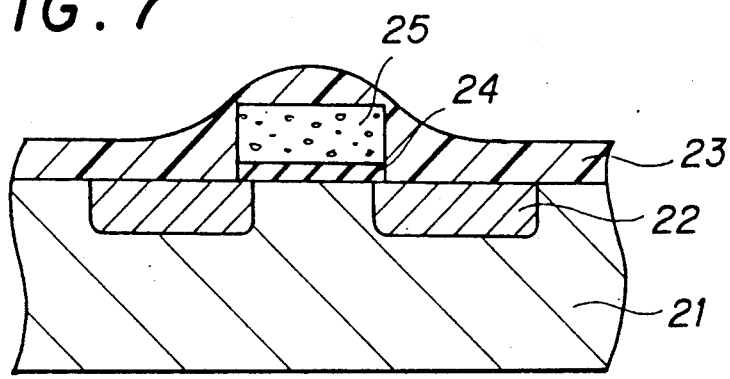
Figure 8:
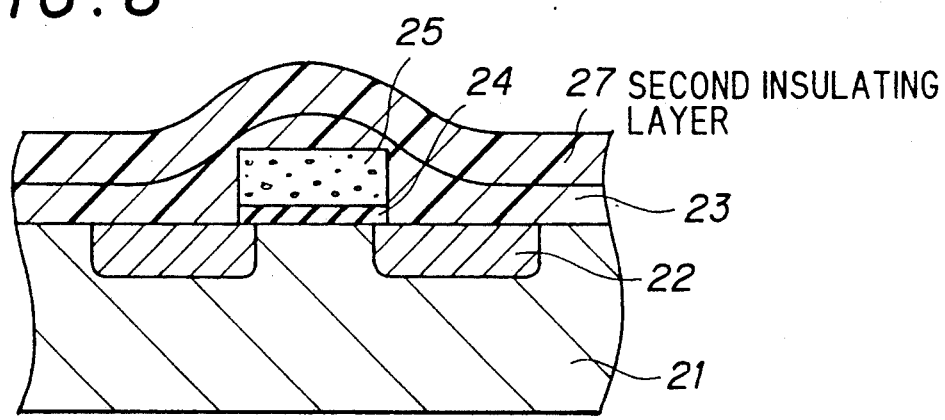

A spin coat layer 26 is then formed on the surface of the first insulating layer 23 by spin coating. The thickness of the spin coat layer 26 is determined to get a result that the thickness A of the layer on the gate electrode 25 and the thickness B of the layer on other areas of the semiconductor device are equal, as shown in FIG. 6. The thickness of the spin coat layer 26 is controlled by adjusting the viscosity thereof or by multicoating thin layers. The spin coat layer 26 can be a silica film for example. The silica film is formed by spin coating a silica material and burning that. Then, the surface of the semiconductor device is etched back by the reactive ion etching (RIE) method until the spin coat layer 26 is removed completely, and the remaining first insulating layer 23 has a uniform thickness as shown in FIG. 7. As shown in FIG. 8, a second insulating layer 27, which is made of borophosphosilicate glass (BPSG) for example, is formed by the CVD method on the surface of the first insulating layer 23 to thicken the insulating layer, so as to strengthen insulation thereof. Then a reflow treatment is done like the case of the formation of the first insulating layer 23. Now, the double insulating layer made of the first and second insulating layers 23 and 27 has a uniform thickness in any region on the semiconductor device.

Figure 9:
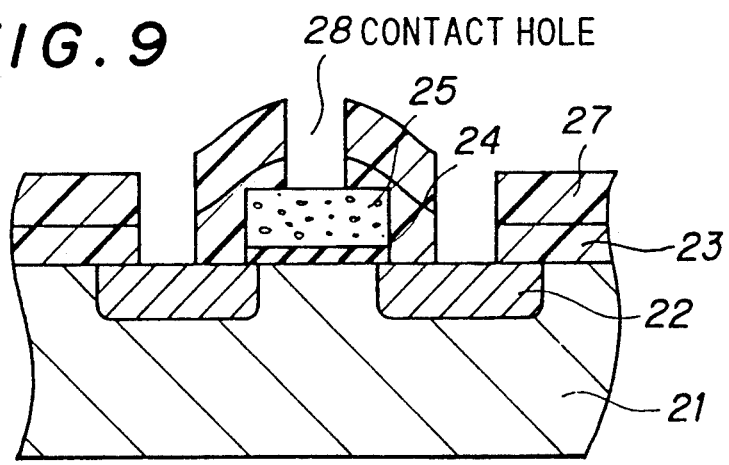
Figure 10:
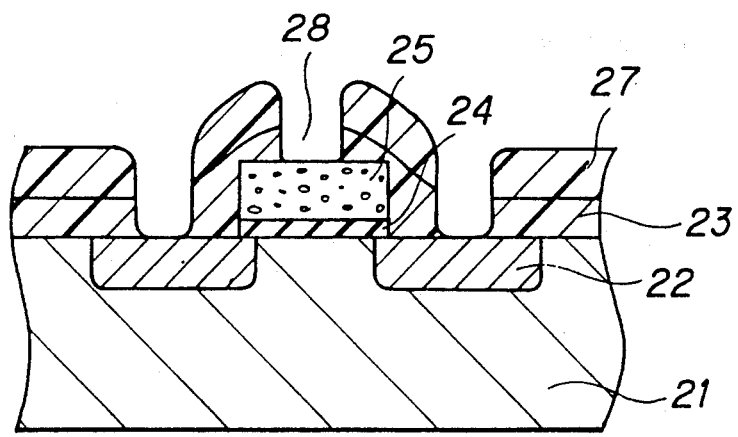

Then, as shown in FIG. 9, contact holes 28 are formed through a photolithography step. The depths of the contact holes 28 are equal in any area on the semiconductor device. Then, a reflow treatment is done to smooth the edges of the contact holes 28, so as to improve the step coverage, as shown in FIG. 10.

Figure 11:
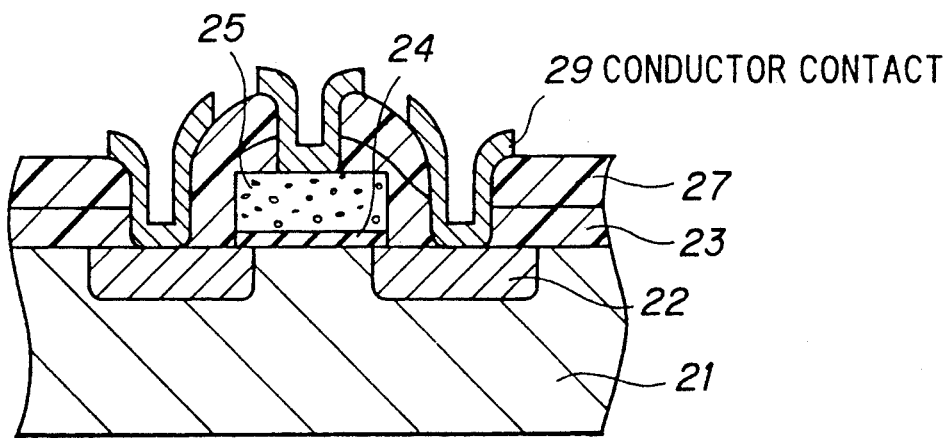

Finally, conductor contacts 29 for interconnection are formed on the contact holes 28 through a photolithography step, as shown in FIG. 11. The step coverage is well improved, so that there is no crack of the conductor contacts 29, especially that of the gate region.

Although the invention has been described with respect to specific embodiment for complete and clear disclosure, the appended claims are not to thus limited but are to be construed as embodying all modification and alternative constructions that may occur to one skilled in the art which fairly within the basic teaching herein set forth. For example, it is possible to omit forming the second insulating layer. In that case, the first insulating layer may be formed to be significantly thick. And, the first insulating layer 23 or the second insulating layer 27 can be made of phosphosilicate glass (PSG) instead of BPSG, or other insulator materials can be usable as far as the reflow performance thereof is excellent. Furthermore, it is not necessary that the first and second insulating layers 23 and 27 are made of the same material, therefore the combination of PSG and BPSG can be adopted for insulating layers. Additionally, the spin coat layer 26 can be an organic film such as a resist film instead of a silica film.

What is claimed is:

1. A method for fabricating a semiconductor device, comprising the steps of:
    forming a first insulating layer having a reflow property by CVD on a main surface of a semiconductor substrate, said first insulating layer being a material which is fluidized by a heat treatment, and having a uniform thickness on a predetermined area thereof;
    fluidizing the first insulating layer by a heat treatment;
    coating the first insulating layer with a spin coat layer;
    etching-back at least the spin coat layer by RIE;
    forming a second insulating layer having a reflow property by CVD on said first insulating layer, said second insulating layer being a material which is fluidized by a heat treatment, and having a uniform thickness on a predetermined area thereof;
    fluidizing the first and second insulating layers by a heat treatment;
    opening a contact hole passing through said first and second insulating layers at a predetermined position thereon;
    fluidizing said first and second insulating layers having said contact hole for rounding an upper edge of the contact hole by a heat treatment; and
    providing a conductor contact for interconnection in said contact hole with a lower portion, a sidewall of the contact hole being of continuous layers, all of which have a reflow property.

2. A method for fabricating a semiconductor device, according to claim 1:
    wherein the thickness of said spin coat layer is adjusted so that the thickness of the layer which consists of said spin coat layer and said first insulating layer is unified on said semiconductor device.

3. A method for fabricating a semiconductor device, according to claim 1:
    wherein said first and second insulating layers are made of the same material.

4. A method for fabricating a semiconductor device, according to claim 1:
    wherein said first and second insulating layers are made of the different materials.

5. A method for fabricating a semiconductor device, according to claim 1:
    wherein at least one of said first and second insulating layer is made of phosphosilicate glass (PSG).

6. A method for fabricating a semiconductor device, according to claim 1:
    wherein at least one of said first and second insulating layer is made of borophosphosilicate glass (BPSG).

7. A method for fabricating a semiconductor device, according to claim 1:
    wherein said spin coat layer is made of a silica film.

8. A method for fabricating a semiconductor device, according to claim 1:
    wherein said spin coat layer is made of an organic material.

9. A method for fabricating a semiconductor device, comprising the steps of:
    forming a first insulating layer of glass on a step portion of a main surface of a semiconductor substrate;
    fluidizing said first insulating layer by a heat treatment;
    forming a spin coat insulating layer on said fluidized first insulating layer;
    etching-back at least said spin coat insulating layer by a reactive ion etching method;
    forming a second insulation layer of glass on said first insulating layer;
    fluidizing said first and second insulating layers by a heat treatment;
    opening a contact hole at a predetermined position on said first and second insulating layers;
    fluidizing by heat treating said first and second insulating layers containing said contact hole; and
    providing a conductor contact for interconnection through said contact hole with a lower portion thereof.

* * * * *